US008451146B2

(12) United States Patent
Mahowald et al.

(10) Patent No.: US 8,451,146 B2
(45) Date of Patent: May 28, 2013

(54) LEGEND HIGHLIGHTING

(75) Inventors: Peter H. Mahowald, Los Altos, CA (US); Omar Sze Leung, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 413 days.

(21) Appl. No.: 12/814,113

(22) Filed: Jun. 11, 2010

(65) Prior Publication Data

US 2011/0304485 A1 Dec. 15, 2011

(51) Int. Cl.

| | |
|---|---|
| ***H03M 11/00*** | (2006.01) |
| ***H01H 13/76*** | (2006.01) |
| ***H01H 13/14*** | (2006.01) |
| ***B44C 1/22*** | (2006.01) |

(52) U.S. Cl.
USPC .................. 341/22; 200/5 A; 200/341; 216/94

(58) Field of Classification Search
USPC ........................ 341/22; 200/5 A, 341; 216/94
See application file for complete search history.

(56) References Cited

U.S. PATENT DOCUMENTS 3,060,790 A 10/1962 Ward
3,754,209 A 8/1973 Molloy et al.
4,855,740 A 8/1989 Muramatsu et al.
5,040,479 A 8/1991 Thrash
5,317,105 A 5/1994 Weber
5,342,991 A 8/1994 Xu et al.
5,456,955 A * 10/1995 Muggli ......................... 427/555
5,770,898 A 6/1998 Hannigan et al.
5,975,953 A 11/1999 Peterson
6,180,048 B1 * 1/2001 Katori ........................... 264/400
6,347,882 B1 2/2002 Vrudny et al.
6,654,174 B1 11/2003 Huang
6,713,672 B1 3/2004 Stickney
6,762,381 B2 * 7/2004 Kunthady et al. ............. 200/512
6,797,902 B2 9/2004 Farage et al.
6,800,805 B2 10/2004 Deguchi
6,834,294 B1 12/2004 Katz
6,998,594 B2 2/2006 Gaines et al.
7,001,060 B1 2/2006 Kimura
7,008,090 B2 3/2006 Blank
7,053,799 B2 5/2006 Yu et al.

(Continued)

FOREIGN PATENT DOCUMENTS

CN 201185147 1/2009
EP 1566686 8/2005

(Continued)

OTHER PUBLICATIONS

Author Unknown, "Electronic Polymers, Semiconducting Polymers and Light Emitting Polymers—Focus of Polythiophene," Azom.com, http://www.azom.com/details.asp?ArticleID=2772, at least as early as Dec. 1, 2005.

(Continued)

*Primary Examiner* — Khai M Nguyen
(74) *Attorney, Agent, or Firm* — Dorsey & Whitney LLP

(57) ABSTRACT

A method for manufacturing keycap includes applying a first coating layer on a surface of a keycap layer, applying a second coating layer on top of the first coating layer, etching at least a portion of the first coating layer to a first depth to form a first etched area, and etching at least a portion of the first etched area to a second depth to form a second etched area.

20 Claims, 3 Drawing Sheets

U.S. PATENT DOCUMENTS

| | | | | |
|---|---|---|---|---|
| 7,088,261 | B2 | 8/2006 | Sharp et al. | |
| 7,109,465 | B2 | 9/2006 | Kok et al. | |
| 7,133,030 | B2 | 11/2006 | Bathiche | |
| 7,161,587 | B2 | 1/2007 | Beck et al. | |
| 7,236,154 | B1 | 6/2007 | Kerr et al. | |
| 7,281,837 | B2 | 10/2007 | Yue et al. | |
| 7,315,908 | B2 | 1/2008 | Anderson | |
| 7,326,154 | B2 | 2/2008 | Foley | |
| 7,364,339 | B2 | 4/2008 | Park | |
| 7,414,213 | B2 * | 8/2008 | Hwang et al. | 200/341 |
| 7,417,624 | B2 | 8/2008 | Duff | |
| 7,446,303 | B2 | 11/2008 | Maniam et al. | |
| 7,453,441 | B1 | 11/2008 | Iorfida et al. | |
| 7,470,862 | B2 | 12/2008 | Lin et al. | |
| 7,470,866 | B2 | 12/2008 | Dietrich et al. | |
| 7,473,139 | B2 | 1/2009 | Barringer et al. | |
| 7,501,960 | B2 | 3/2009 | Price et al. | |
| 7,557,690 | B2 | 7/2009 | McMahon | |
| 7,598,686 | B2 | 10/2009 | Lys et al. | |
| 7,710,369 | B2 | 5/2010 | Dowling | |
| 7,750,282 | B2 | 7/2010 | Mahowald et al. | |
| 7,750,352 | B2 | 7/2010 | Thurk | |
| 7,769,353 | B2 | 8/2010 | Dietrich et al. | |
| 7,778,590 | B2 | 8/2010 | Kogo | |
| 7,825,917 | B2 | 11/2010 | Bryant et al. | |
| 7,845,953 | B2 | 12/2010 | Brock et al. | |
| 7,863,822 | B2 | 1/2011 | Stoschek et al. | |
| 7,880,131 | B2 | 2/2011 | Andre et al. | |
| 7,968,835 | B2 | 6/2011 | Tsai | |
| 8,017,216 | B2 * | 9/2011 | Kato et al. | 428/131 |
| 8,018,170 | B2 | 9/2011 | Chen et al. | |
| 8,080,753 | B2 * | 12/2011 | Yeh et al. | 200/341 |
| 2003/0174072 | A1 | 9/2003 | Salomon | |
| 2003/0210221 | A1 | 11/2003 | Aleksic | |
| 2004/0032745 | A1 | 2/2004 | Pederson | |
| 2004/0230912 | A1 | 11/2004 | Clow et al. | |
| 2004/0238195 | A1 | 12/2004 | Thompson | |
| 2005/0073446 | A1 | 4/2005 | Lazaridis et al. | |
| 2006/0022951 | A1 | 2/2006 | Hull | |
| 2006/0158353 | A1 | 7/2006 | Tseng | |
| 2008/0001787 | A1 | 1/2008 | Smith et al. | |
| 2008/0127537 | A1 | 6/2008 | Boisseau | |
| 2008/0166006 | A1 | 7/2008 | Hankey et al. | |
| 2008/0303918 | A1 | 12/2008 | Keithley | |
| 2009/0201179 | A1 | 8/2009 | Shipman et al. | |
| 2009/0277763 | A1 | 11/2009 | Kyowski et al. | |
| 2010/0008030 | A1 | 1/2010 | Weber et al. | |
| 2010/0044067 | A1 | 2/2010 | Wong et al. | |
| 2010/0265181 | A1 | 10/2010 | Shore | |
| 2010/0300856 | A1 | 12/2010 | Pance et al. | |
| 2010/0301755 | A1 | 12/2010 | Pance et al. | |
| 2010/0302169 | A1 | 12/2010 | Pance et al. | |
| 2010/0306683 | A1 | 12/2010 | Pance et al. | |
| 2011/0280042 | A1 | 11/2011 | Pance et al. | |
| 2012/0012448 | A1 | 1/2012 | Pance et al. | |
| 2012/0013490 | A1 | 1/2012 | Pance | |

FOREIGN PATENT DOCUMENTS

| | | |
|---|---|---|
| EP | 1881513 | 1/2008 |
| EP | 2017694 | 1/2009 |
| GB | 2431001 | 4/2007 |
| JP | 60004094 | 1/1985 |
| KR | 100870113 | 11/2008 |
| WO | WO2007/002796 | 1/2007 |
| WO | WO2007/102633 | 9/2007 |
| WO | WO2009/136929 | 11/2009 |

OTHER PUBLICATIONS

Author Unknown, “Long Polymers Light up LEDs,” Physicsweb.org, http://www.physicsweb.org/articles/news/6/4/22/1, at least as early as Apr. 30, 2002.

Author Unknown, “Optimus Keyboard,” Art.Lebedev Studio, http://www.artlebedev.com/portfolio/optimus/, at least as early as Dec. 1, 2005.

Author Unknown, “Optimus OLED Keyboard,” Gizmodo: The Gadgets Weblog, http://www.gizmodo.com/gadgets/peripherals/input/optimus-oled-keyboard-112517.php, at least as early as Dec. 1, 2005.

Author Unknown, “Optimus OLED Keyboard with Customizable Layout,” Gear Live, http://www.gearlive.com/index.php/news.article/optimus_oled_keyboard_07131058/, at least as early as Dec. 1, 2005.

Author Unknown, “Optimus Russian Keyboard,” Primo Tech, http://www.primotechnology.com/index.php?art+articles/0705/optimus/index.htm, at least as early as Dec. 1, 2005.

Author Unknown, “Organic Light-Emitting Diode,” Wikipedia.com, http:/en.wikipedia.org/wiki/OLED, at least as early as Dec. 1, 2005.

Author Unknown, “Organic Polymers to Precede Nano Semi,” EETimes.com, http://www.eet.com/story/OEG20030923S0055, at least as early as Dec. 1, 2005.

Author Unknown, “How, Why & Where to Use Self-Clinching Fasteners,” PennEngineering, http://www.pemnet.com/fastening_products/about_self_clinching/index.html, 2 pages, at least as early as Dec. 21, 2011.

Author Unknown, “Physics News Update,” American Institute of Physics, http://www.aip.org/pnu/1993/split/pnu148-3.htm, Oct. 19, 1993.

Author Unknown, “Polymer Light-Emitting Diodes,” Philips Research—Technologies, http://www.research.philips.com/technologies/display/polyled/polyled/, at least as early as Dec. 1, 2005.

Author Unknown, “What is OLED (Organic Light Emitting Diode)?,” WiseGeek.com, http://www.wisegeek.com/what-is-an-oled.htm?referrer+adwords_campaign=oled_ad=024..., at least as early as Dec. 1, 2005.

Author Unknown, “What is PLED?—A Word Definition from the Webopedia Computer Dictionary,” http://www.webopedia.com/TERM/P/PLED/html, at least as early as Dec. 1, 2005.

Braun et al., “Transient Repsonse of Passive Matrix Polymer LED Displays,” http://www.ee.calpoly.edu/~dbraun/papers/ICSM2000BraunEricksonK177.html, at least as early as Dec. 1, 2005.

Rojas, “Optimus Keyboard Trumped by the Display Keyboard?,” http://www.engadget.com/2005/07/29/optimus-keyboard-trumped-by-the-display-keyboard/, Jul. 29, 2005.

* cited by examiner

107

105

109

S
101
100

109
113
111
W1
W2
2-2

LEGEND HIGHLIGHTING

TECHNICAL FIELD

Embodiments disclosed herein relate generally to methods for displaying a graphic on a surface, and more specifically to methods of displaying legends or graphics on a backlit surface.

BACKGROUND

Electronic devices are ubiquitous in society and can be found in everything from household appliances to computers. Many electronic devices include graphics that are etched onto the outermost surface of these devices. The graphics can be used for various purposes, and may take the form of any design or shape, including text, symbols, decorative patterns, and so on. In some cases, the graphics may be selectively or fully backlit. One example of such a graphic is the legend that is etched onto the keycap of a keyboard.

While providing attractive backlit graphics for a user is very important in many electronic devices, much of the aesthetic appeal of a device can quickly be compromised if a graphic does not transmit enough light to be adequately perceived by a user. The aesthetic appeal of a device may also be diminished if the graphic is not sufficiently contrasted with the unetched surfaces of the device, which may make a graphic difficult to discern.

While many designs for etching graphics onto the surfaces of electronic and personal devices have generally worked well in the past, there is always a desire to provide new and improved designs or techniques that result in even more aesthetically pleasing graphics. In particular, the ability to provide backlit graphics on electronic and personal devices in a manner that can generate a sufficient amount of light and provide contrast with the unetched surfaces of the device is desirable.

SUMMARY

Generally, embodiments described herein are directed to methods for etching graphics onto backlit surfaces, such as keycaps. The keycaps may include a fully or partially transparent keycap layer that may be covered by multiple coating layers. The keycap may be etched to remove the top or outermost coating layer and expose the second or middle layer. The second or middle layer may be etched to different depths so that when illuminated, the etched portion having a larger depth may transmit more light than the etched portion having a smaller depth.

One embodiment may take the form of a method for manufacturing keycap. The method may include applying a first coating layer on a surface of a keycap layer, applying a second coating layer on top of the first coating layer, etching at least a portion of the first coating layer to a first depth to form a first etched area, and etching at least a portion of the first etched area to a second depth to form a second etched area.

Another embodiment may take the form of a keycap including a keycap layer, a first coating layer covering at least a portion of the keycap layer, and a second coating layer covering at least a portion of the first coating layer. A first portion of the first coating layer may define a graphic having a first depth and a second portion of the first coating may define a border surrounding at least a portion of a perimeter of the graphic. The second portion may have a second depth greater than the first depth.

A further embodiment may take the form of a keyboard including at least one key including a keycap and a light source configured to illuminate the keycap. The keycap may include a keycap layer, a first coating layer adjacent the keycap layer, and a second coating layer adjacent the first coating layer. At least a portion of the keycap may define a graphic and a border. The graphic may have a first depth and the border may surround a perimeter of the graphic and have a second depth larger than the first depth.

DETAILED DESCRIPTION

Generally, embodiments described herein are directed to methods for etching graphics onto backlit surfaces, such as keycaps. The keycaps (or other surfaces) may be fully or partially covered by multiple coating layers. The keycap may be etched to remove the top or outermost coating layer and expose the second or middle layer. The second or middle layer may be etched to different depths on different portions of the graphic or legend so that, when illuminated, the etched portion having a larger depth may transmit more light than the etched portion having a smaller depth.

In some embodiments, a keycap may be etched to form a graphic or legend. The graphic may include a central portion and a border that outlines the perimeter of the graphic. The central portion may be etched to a lesser depth than the border so that when the keycap is illuminated, the border appears brighter to a user than the graphic, creating a highlighting effect and providing further contrast between the graphic and the unetched portions of the keycap.

Although the disclosure generally discusses etching in the context of keycaps and/or keys on a keyboard, it should be understood that the techniques, methods, operations and the like described herein may be applied to a number of different apparatuses. For example, a logo on the exterior of an electronics housing may be etched in the fashion described herein, as may portions of a trackpad, touchpad, mouse or other input (or output) device.

Figures 1A, 1B, 1C:
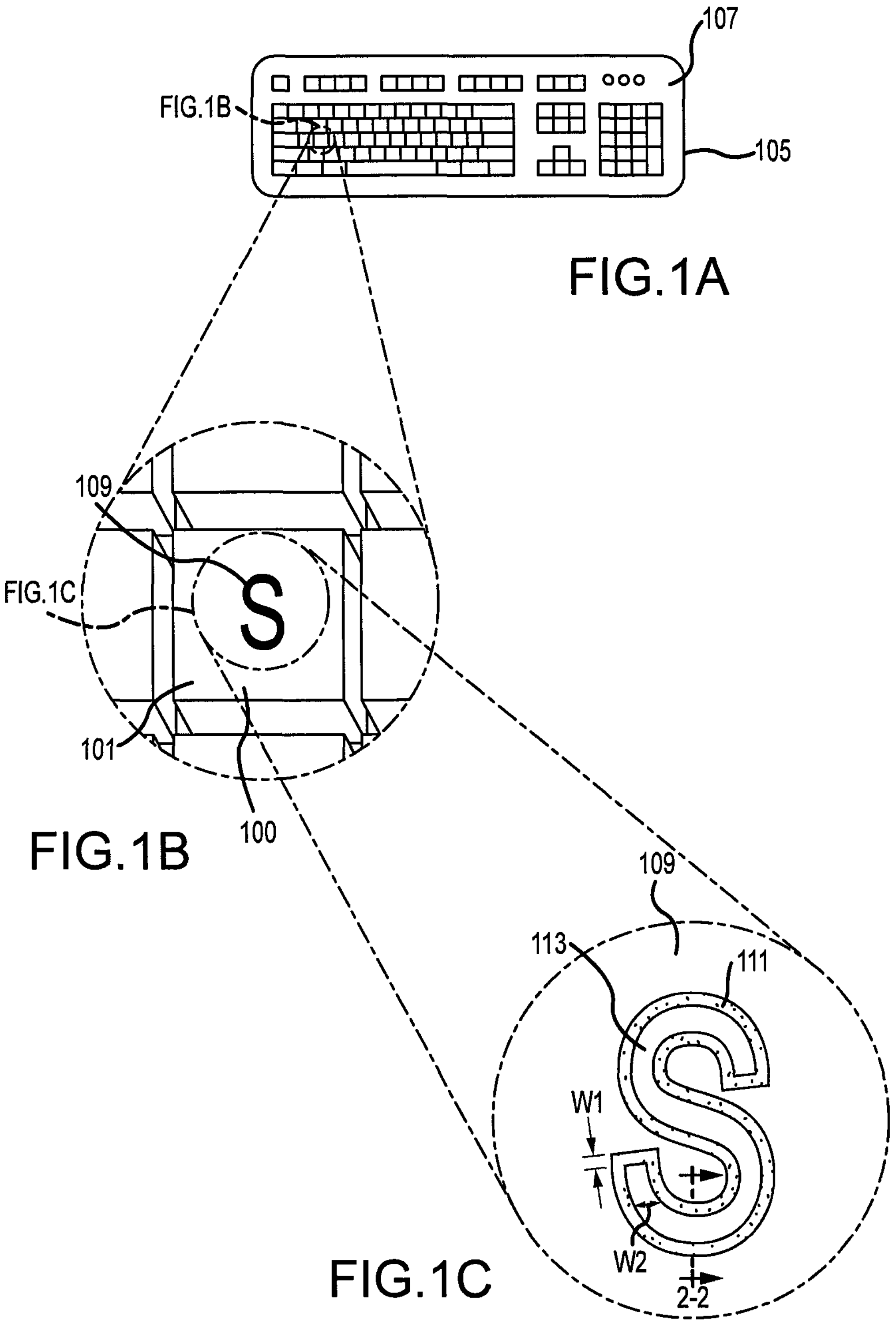
FIG. 1A illustrates a top elevation view of a sample keyboard.
FIG. 1B illustrates a closeup top perspective view of a sample keycap of the sample keyboard of FIG. 1A.
FIG. 1C illustrates a closeup top elevation view of a sample graphic on the sample keycap of FIG. 1B.

As shown in FIG. 1A, in one embodiment, the etched surface may be a keycap 101 on a keyboard 105. As is known, keycaps 101 may extend upward from a keyboard housing 107, or otherwise be associated therewith, and may serve as user inputs for interacting with an electronic device. Some of the keycaps 101 may correspond to alphanumeric symbols while other keycaps 101 may correspond to other commands or inputs. The keycaps 101 and housing 107 may encase the electronic and mechanical components of the keyboard 105, which may include, but are not limited to, wires, a processing unit, various chips, light sources and/or light guides, as well as any other components required to operate the computer 101.

Other embodiments can be used to form graphic and/or borders on other surfaces. For example, certain embodiments may be used to form the exterior surface of a housing for an electronic device, such as a mobile telephone, a laptop or notebook computer, a tablet computing device, a desktop computer, a television, a stereo receiver, or practically any other electronic device. Alternate embodiments may not be electronics housings at all, but instead may be any number of objects typically formed from metals or plastics. For example, certain embodiments may be formed as described herein to create serving utensils or dishes, signs, advertisements and the like.

As shown in FIG. 1B, the outermost surface of each keycap 101 (e.g., the surface with which the user interacts or sees) may include a graphic 109 or legend that may correspond to the input issued when the keycap 101 is pressed. For example, the keycap 101 shown in FIG. 1B corresponds to the letter "S," and the graphic 109 illustrated on the keycap 101 is the letter "S." Each keycap 101 on the keyboard 105 may have a different graphic 109. However, other embodiments may have multiple keycaps 101 with the same graphic 109. The graphic may be any design, including alphanumeric symbols, patterns, text, and so on.

Continuing to FIG. 1C, the graphic 109 of FIGS. 1A and 1B is shown in closeup and partially cut-away view, in order to accentuate the features of the graphic 109. This closeup view of the graphic 109 depicts the etched pattern forming the visual display element 109.

As mentioned above, the graphic 109 may be formed in the shape of a design. This design may be engraved or etched into the exterior surface of the keycap 101. In one embodiment, the design may be etched using a laser. The laser may be provided by a computer numerical controlled laser tool, and may have any suitable wavelength for incising the surface of the keycap 101. For example, the laser may be an ultraviolet laser, a green laser, a YAG laser, and the like depending on the desired size and shape of the graphic 109. Other methods for engraving the keycaps 101 may entail the use of other techniques and/or machinery, as is known.

A border 111 may outline the perimeter of the graphic 109 to partially or fully surround the graphic. The graphic 109 may be a different color, shade and/or texture from the unetched portions of the keycap 101, so as to distinguish the graphic 109 from the keycap 101. For example, in one embodiment, the graphic 109 may be a lighter color or shade from the rest of the keycap surface. The border 111 may be the same color and/or shade as the graphic 109, or, in other embodiments, may be a different color, shade, and/or texture from the graphic 109.

In one embodiment, the border 111 may have a uniform width W1. However, in other embodiments, the width of the border around the graphic may vary. In one embodiment, the portion of the border lining the outside edges of the legends may have a larger width than the portion of the border lining the inside edges of the legends. Accordingly, the outside edges of the legends may appear bolder than the inside edges. For example, with respect to the letter "A," the portion of the border forming the upper triangular portion of the letter "A" may have a smaller width than the outside border of the letter. Similarly, with respect to the letter "S," the portion of the border forming the top curved edge of the "S" may have a larger width than the portion of the border forming the bottom curved edge. Alternatively, in some embodiments, the portion of the border lining the outside edges of the legends may have a smaller width than the portion of the border lining the inside edges of the legends so that the inside edges of the legends may appear bolder than the outside edges.

In one embodiment, the border 111 have a width of between 0.3-0.5 mm. A width within this range may enhance the spatial resolution of the border so that the human eye may distinguish the border from the graphic. The typical human eye can resolve distinct lines and edges that are set approximately 0.3 mm to 0.5 mm apart; this is a spatial frequency to which the human eye is attuned. Maintaining the width of the border at or near this spatial frequency may enhance the visibility of the border.

In other embodiments, the border 111 may have a width of greater than 0.5 mm or less than 0.3 mm. In further embodiments, the width of the border 111 may be thicker or narrower depending on the visual effect desired. For example, a thicker border may create a more visually distinct outline around the graphic 109 since it will permit more light to pass therethrough, while a narrower outline may create a visually fainter outline around the graphic. Similarly, the width W2 of the graphic 109 may also vary according to different embodiments. As another example, in another embodiment, the graphic 109 may have a width of between 0.5 and 1 mm. Essentially, the depth to which the border 111 is etched in a particular layer of the keycap (described below) controls the amount of light that passes through the border, and thus its visibility.

Figure 2A:
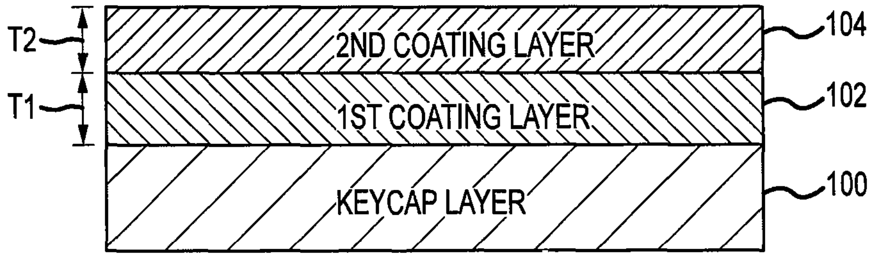
FIG. 2A illustrates a closeup and partially cutaway side cross-sectional view of a sample keycap shown during manufacturing before the keycap is etched, as taken along a line similar to line 2-2 of FIG. 1C.
Figure 2B:
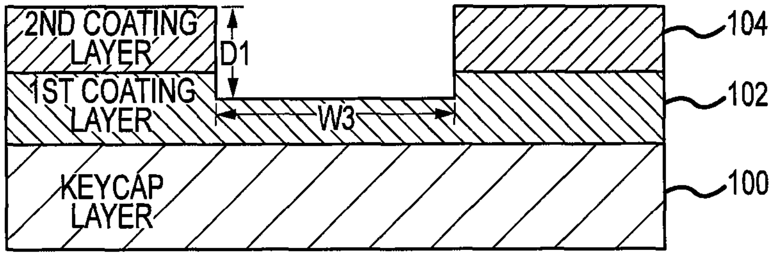
FIG. 2B illustrates a closeup and partially cutaway side cross-sectional view of a sample keycap shown during manufacturing after a first etching step, as taken along a line similar to line 2-2 of FIG. 1C.
Figure 2C:
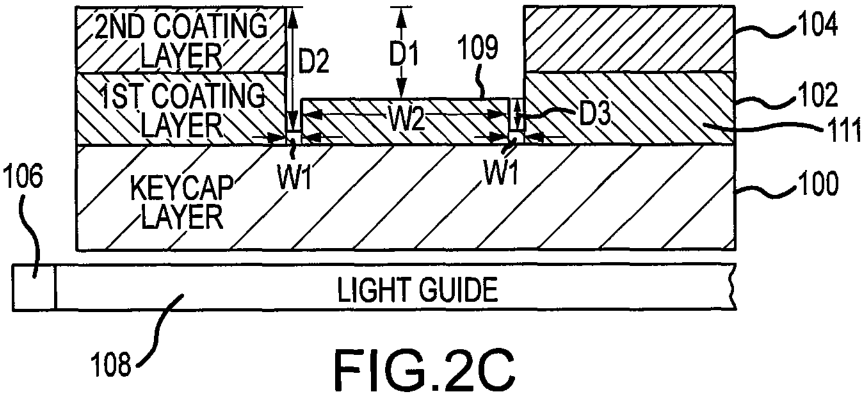
FIG. 2C illustrates a closeup and partially cutaway side cross-sectional view of a sample keycap shown during manufacturing after a second etching step, as taken along a line similar to line 2-2 of FIG. 1C.

FIGS. 2A-2C illustrate partial cross-sectional views of the embodiment of the keycap 101 and graphic 109 shown in FIG. 1C in various stages of manufacturing. FIG. 2A illustrates a keycap 101 prior to etching. As is shown, the keycap 101 may include one or more coating layers that are deposited over the outermost surface of a keycap layer 100. In one embodiment, the keycap 101 may include a first coating layer 102 that is deposited across at least a portion of the outermost surface of the keycap layer 100 and a second coating layer 104 that is deposited over at least a portion of the first coating layer.

The first and second coating layers 102, 104 may cover all, or only a portion of, the outermost surface of the keycap layer 100. For example, in one embodiment, the first and/or second coating layers may only be deposited on the top surface of the keycap layer, as opposed to the top and side surfaces of the keycap layer. In another embodiment, the first and/or second coating layers may be deposited on only a portion of the top surface of the keycap layer. For example, the first and/or second coating layers may be deposited in the shape of the graphic, or as a patch. In other embodiments, the entire outer surface of the keycap layer may be covered by the first and/or second coating layers.

In one embodiment, the keycap layer 100 may be formed from a polymeric material, including, but not limited to, plastic, silicone, rubber, and so on. For example, in the particular embodiment illustrated in FIGS. 2A-2C, the keycap layer 100 may be formed from a clear plastic. Other embodiments may include different configurations of keycap layers. For example, the keycap may be formed from a different material, such as a metal, ceramic, and so on. Additionally, in some embodiments, the keycap layer 100 may be only partially transparent and/or opaque. In further embodiments, the keycap layer may be formed from a tinted or color transparent layer. When the keycap layer 100 is transparent, it generally permits more light to shine through it and thus through the border 111. If a colored, transparent or translucent keycap layer is used, the light emanating through the border may be tinted, colored or more diffuse and so on. Accordingly, the keycap layer may be formed from a variety of materials depending on the illumination effect to be created.

The keycap layer 100 may be flexible or rigid. For example, in some embodiments, the keycap layer 100 may be formed from a rigid plastic that resists deformation when depressed by a user. In other embodiments, the keycap layer 100 may be formed from a less rigid material that may bend when depressed or otherwise manipulated by a user.

In one embodiment, the first coating layer may be formed by a paint. The paint may be deposited onto the keycap 100 using any known paint deposition technique, including a spray application, a liquid application, and so on. The paint may be any type of paint, including a titanium dioxide-loaded paint, a latex-based paint, a rubber-based paint, a plastic paint, and so on. The paint may be different colors according to different embodiments. For example, in one particular embodiment, the first coating layer may be a white paint layer. The paint may further include pigment brighteners in the form of a powder or a liquid to increase the apparent brightness or whiteness of the paint.

In other embodiments, the first coating layer may be a different colored paint or multiple colors of paint, or formed from a different material altogether. For example, a portion of the first paint layer may be a first color, and another portion of the first paint layer may be a different color than the first color. In other embodiments, the first coating layer may be a polymeric, or other material, rather than a paint layer.

The second coating layer may also be a paint layer. The paint may be deposited onto the keycap 100 in a manner similar to that described with respect to the first coating layer. The paint may be any type of paint, including a titanium dioxide-loaded paint, a latex-based paint, a rubber-based paint, a plastic paint, and so on.

Similar to the first coating layer, the paint may be different colors according to different embodiments. For example, in one particular embodiment, the second coating layer 104 (e.g., the upper layer) may be a black, white or colored paint layer. The second coating layer may be a different color or shade than the first coating layer to provide contrast between the two layers. For example, the second coating layer may be a darker shade or color than the first coating layer, or alternatively, the first coating layer may be a darker shade or color than the second coating layer. However, in other embodiments, the second coating layer may be the same color as the first coating layer.

As mentioned, the second coating layer may be a different colored paint, formed from multiple colors of paint, or formed from a different material altogether. For example, a portion of the second paint layer may be a first color, and another portion of the second paint layer may be a different color than the first color. In other embodiments, the second coating layer may be a polymeric, or other material, rather than a paint layer.

The thicknesses T1 and T2 of the first and second coating layers may vary according to different embodiments. In one embodiment, the first coating layer may have a thickness of between approximately 5 and 15 μm, and the second coating layer may have a thickness of between approximately 5 and 15 μm. However, in other embodiments, the first and/or second coating layers may be thicker or thinner. In one embodiment, the first coating layer may be thicker than the second coating layer. In other embodiments, the first and second coating layers may be of substantially equal thicknesses, or the second coating layer may be thicker than the first coating layer.

Other layers may also be applied before or after the first and/or second coating layers. For example, in one embodiment, a lacquer or other finishing paint may be applied on top of the second coating layer to provide a glossy finish to the keys of the keyboard. In another embodiment, a paint or plastic layer may be applied on top of the second coating layer. In other embodiments, the first and/or second coating layers may be textured using a laser or mechanical etching technique. For example, the first and second coating layers may have different textures so as to enhance the contrast between the graphic, border, and the unetched surfaces of the keycap.

FIG. 2B illustrates a keycap 101 after a first etching step, in which the keycap is etched to a first depth D1 so that the first paint layer is exposed. In one embodiment, a laser configured to cut to a particular depth may be passed along the surface of the keycap 101. The laser beam may be configured to cut through the second layer 104 and into the first layer 102 to a predetermined depth D1, and may further cut the shape of the graphic into the first and/or second layers. The path of the beam may be confined to a predetermined width W3, which, in one embodiment, may be the width W1 of each border 111, combined with the width W2 of the graphic W2. That is, W3 may equal (2*W1)+W2.

FIG. 2C illustrates a finished keycap 101 after a second etching step, in which the keycap 101 is etched to a second depth D2 to form the border 111 around the graphic 109. In one embodiment, a laser configured to cut the shape of the border 111 may be passed along the perimeter of the graphic formed during the first etching step to form the border 111. The laser beam may be configured to cut the first coating layer 102 of the keycap 101 to a third depth D3. Accordingly, the second etching step may create a border 111 around the perimeter of the graphic 109 that has a larger depth D2 than the depth D1 of the graphic 109.

Other embodiments may utilize different etching techniques than those described above. For example, in another embodiment, the graphic may have a larger depth than the border, rather than vice versa. Additionally, in some embodiments, the border may not outline the entire perimeter of the graphic, but may only outline a portion of the perimeter of the graphic. In one embodiment, the portion of the border lining the outside edges of the legends may have a larger depth than the portion of the border lining the inside edges of the legends. Accordingly, the outside edges of the legends may appear brighter than the inside edges. In some embodiments, the portion of the border lining the outside edges of the legends may have a smaller depth than the portion of the border lining the inside edges of the legends so that the outside edges of the legend may appear dimmer than the inside edges of the legend. In further embodiments, the laser beam in the second etching step may be configured to cut the body portion of the graphic, rather than around the perimeter of the graphic.

Referring to FIG. 2C, in one embodiment, the keycap 101 may be backlit by a light source 106. The light source 106 may be positioned behind one or more of the keycaps 101 so that they are backlit, for example to create a pleasing visual effect and/or facilitate use of the keyboard in dark environments. In one embodiment, the light source 106 may be coupled to a light guide 108 configured to transmit the light to the keycap 101. The light source 106 may be any light source, including, but not limited to, a light emitting diode, a liquid crystal element, an electroluminescent light, or any other suitable light source for such a purpose. The light source may be a side-firing light source, so that it transmits light along the X-Y plane. In other embodiments, may be a vertical-firing light source, e.g., so that it transmits light in the Z-direction toward the back of the keycap and ultimately out through the border 111.

The light guide 108 may be a light guide panel that includes a planar surface 230 facing the keycap. In some embodiments, the light guide may further define one or more concave microlenses 225 and/or microperforations to refract and/or reflect light in the Z-direction. The number, positioning, and/or spacing of light sources and/or light guides used to illuminate the keyboard 105 may be varied to create different visual effects.

When illuminated, the border 111 around the graphic 109 may appear brighter than the graphic 109. This effect may be attributed to the increased depth of the border 111, as compared to the graphic 109, with respect to the surface of the keycap 101. Since more of the first coating layer 102 is etched away to create the border 109, light from the light guide 108 may pass through a thinner portion of the first coating layer 102 to reach the eyes of a user. In contrast, since less of the first coating layer 102 is etched away to create the graphic 109, light from the light guide 108 is required to pass through a thicker portion of the first coating layer 102 to reach the eyes of a user. Accordingly, the perimeter of the graphic may appear to be highlighted and the contrast between the keycap surface and the graphic may be enhanced. Additionally, the graphic may appear brighter to a viewer without increasing the amount of light used to backlight the graphic.

As discussed above, in some embodiments, the first coating layer 102 may include pigment brighteners. Accordingly, the surface of the graphic 109 may be configured to appear brighter when light impacts on the surface of the graphic and enhance the appearance of the graphic 109, e.g., when the light source is turned off. By increasing the brightness of the first layer 102, the key, legend, graphic and the like 109 may be more visible when not backlit. Accordingly, in certain embodiments, the border 111 extends into, but not through, this first layer.

The widths W1 and W2 of the border 111 and/or the graphic 109 may be varied to create different visual effects. For example, a wider border 111 may further emphasize the outline of the border around the graphic and enhance the contrast between the keycap surface and the graphic, while a narrower border may provide a less noticeable outline and fainter contrast between the keycap surface and the graphic.

The etching depths of the laser may be similarly varied. For example, in one embodiment, the first coating layer may be etched to a maximum depth at the border 111 to enhance the amount of light passing through the keycap without damaging the surface of the keycap layer 100. In other embodiments, the laser beam may be configured to cut through the first coating layer at the border 111 to expose the keycap layer 100. In further embodiments, the graphic 109 may be formed by etching into only the second coating layer, and the border 111 may be formed by etching into the first coating layer. Additionally, in some embodiments, the graphic 109 may be etched to a larger depth than the border 111.

Figure 3:
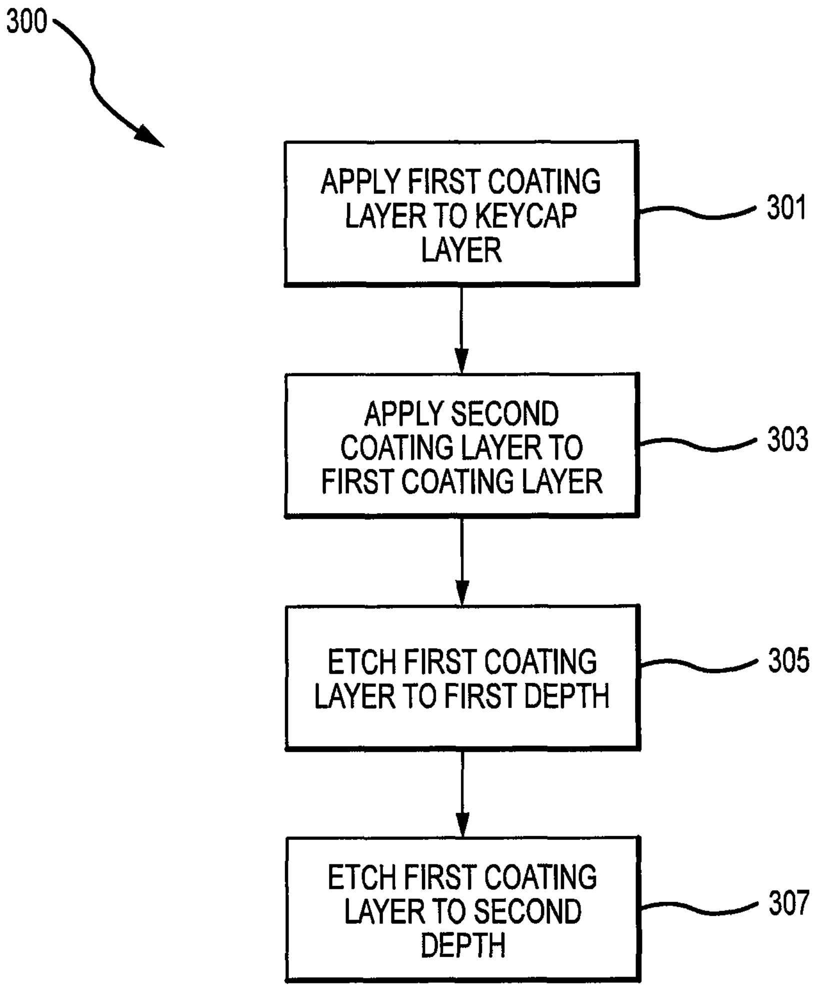
FIG. 3 is a flowchart setting forth a sample method for manufacturing a sample keycap.

FIG. 3 is a flowchart showing one sample method 300 for manufacturing a keycap including a graphic. It should be understood that certain operations may be performed in orders other than those shown here. Accordingly, variations on the sample method will be readily apparent to those of ordinary skill in the art and are contemplated and embraced by this document. Further, the order of the operations shown here is for convenience only and should not be interpreted as necessitating any particular order for manufacture.

In operation 301, a first coating layer is applied to the outermost surface of the keycap layer. In one embodiment, the first coating layer may be a paint layer that is distributed across the outermost surface of the keycap. As discussed above, in one embodiment, the first coating layer may be opaque, and the keycap layer may be a clear keycap. The first coating layer may be applied to all or only a portion of the outermost surface of the keycap layer. As discussed above, the first coating may include pigment enhancers and appear brighter when light impacts on the first coating layer.

In operation 303, a second coating layer is applied over the first coating layer. In one embodiment, the second coating layer may be a paint layer that is distributed over the first coating layer. The second coating layer may also be an opaque paint. In one embodiment, the second coating layer may be a different shade or color than the first coating layer. For example, the second coating layer may be a darker color than the first coating layer.

In operation 305, the first coating layer is etched to a first depth. As discussed above, a laser beam may be configured to cut the keycap in the shape of the graphic. The laser beam may be configured to cut through the second coating layer of the keycap and cut the first coating layer to a first depth. In operation 307, the first coating layer is etched to a second depth. As discussed above, this operation may form a border outlining the graphic. In one embodiment, a laser beam configured to cut the shape of the border may be passed along the perimeter of the graphic formed in operation 305. The laser beam may be configured to cut the first coating layer of the keycap to a predefined depth so that the depth of the border is larger than the depth of the graphic.

The foregoing has been generally described with respect to particular embodiments and methods of manufacture. It will be apparent to those of ordinary skill in the art that certain modifications may be made without departing from the spirit or scope of this disclosure. Accordingly, the proper scope of this disclosure is set forth in the following claims.

We claim:

1. A method for manufacturing keycap comprising:
- applying a first coating layer on a surface of a keycap layer;
- applying a second coating layer on top of the first coating layer;
- etching at least a portion of the first coating layer to a first depth to form a first etched area; and
- etching at least a portion of the first etched area to a second depth to form a second etched area.

2. The method of claim 1, wherein the first etched area and the second etched area overlap.

3. The method of claim 1, wherein the second etched area includes a perimeter of the first etched area.

4. The method of claim 3, wherein the second etched area has a width of between 0.3 to 0.5 mm.

5. The method of claim 1, wherein the first coating layer comprises a paint layer.

6. The method of claim 5, wherein the second coating layer comprises a paint layer.

7. The method of claim 6, wherein the first coating layer is lighter than the second coating layer.

8. The method of claim 1, wherein the first coating layer is etched to the second depth to form the second etched area.

9. The method of claim 8, wherein a portion of the second coating layer overlapping the first etched area is removed by etching.

10. A keycap, comprising:
- a keycap layer;
- a first coating layer covering at least a portion of the keycap layer; and a second coating layer covering at least a portion of the first coating layer;

wherein a first portion of the first coating layer defines a graphic having a first depth and a second portion of the first coating defines a border surrounding at least a portion of a perimeter of the graphic having a second depth greater than the first depth.

11. The keycap of claim 10, wherein the graphic and the border are formed by laser etching a surface of the keycap.

12. The keycap of claim 10, wherein the first coating layer comprises a first paint layer and the second coating layer comprises a second paint layer, and the second paint layer is a different color than the first paint layer.

13. The keycap of claim 12, wherein the second paint layer includes a pigment brightener.

14. The keycap of claim 13, wherein the first coating layer is lighter than the second coating layer.

15. The keycap of claim 10, wherein the perimeter has a width of between 0.3 to 0.5 mm.

16. The keycap of claim 15, wherein the width of the perimeter varies around the graphic.

17. A keyboard comprising:

at least one key including a keycap; and a light source configured to illuminate the keycap, the keycap comprising:

a keycap layer;

a first coating layer adjacent the keycap layer;

a second coating layer adjacent the first coating layer;

wherein at least a portion of the keycap defines a graphic and a border, the graphic having a first depth and the border surrounding a perimeter of the graphic and having a second depth larger than the first depth.

18. The keyboard of claim 17, wherein the graphic and the border are formed by etching the first coating layer to different depths.

19. The keyboard of claim 17, wherein the border of the keycap is configured to transmit more light than the graphic when the keycap is illuminated by the light source.

20. The keyboard of claim 17, wherein a width of the border surrounding the perimeter of the graphic varies around the graphic.

* * * * *